(12) United States Patent
Naqvi

(10) Patent No.: US 8,673,655 B1
(45) Date of Patent: Mar. 18, 2014

(54) SEMICONDUCTOR PACKAGE REPAIR PROCESS

(75) Inventor: Asim Naqvi, Trophy Club, TX (US)

(73) Assignee: Gamestop Texas, Ltd., Grapevine, TX (US)

( * ) Notice: Subject to any disclaimer, the term of this patent is extended or adjusted under 35 U.S.C. 154(b) by 214 days.

(21) Appl. No.: 13/402,746

(22) Filed: Feb. 22, 2012

Related U.S. Application Data

(60) Provisional application No. 61/445,360, filed on Feb. 22, 2011.

(51) Int. Cl.
*H01L 21/00* (2006.01)
(52) U.S. Cl.
USPC ............ 438/4; 438/18; 438/48; 257/E21.001; 257/E21.521
(58) Field of Classification Search
USPC .......... 438/4–18, 312; 257/48, 499, 678, 734, 257/E21.74, E21.68, E21.83; 324/750.09, 324/750.11, 756.02, 762.01, 762.02; 219/48, 499, 678, 734, 121.68, 121.74, 219/121.83
See application file for complete search history.

(56) References Cited

U.S. PATENT DOCUMENTS

2003/0197518 A1* 10/2003 Miyakita ................ 324/750
2010/0066398 A1* 3/2010 Ando et al. ............. 324/760
2011/0215825 A1* 9/2011 Shin et al. ............ 324/762.01

* cited by examiner

*Primary Examiner* — Charles Garber
*Assistant Examiner* — Abdulfattah Mustapha
(74) *Attorney, Agent, or Firm* — Baker & Hostetler LLP

(57) ABSTRACT

An electronic package implemented in an electronic device may include a damaged connection that restricts electrical communication between components in the electronic package. For example, the damaged connection may restrict communication between a silicon unit, such as a processor die for example, and a printed circuit board. The damaged connection may be repaired without damaging other components in the electronic package by using a repair apparatus that includes a heating element and a cooling element. The heating element may be activated to transfer heat to the electronic package for reforming the damaged connection between components to enable effective electrical communication. The cooling element may be activated for cooling components in the electronic package to prevent damage due to the transfer of the heat from the heating element. The heating element and/or the cooling element may be activated in a predetermined pattern to facilitate the repair of the damaged connection.

21 Claims, 12 Drawing Sheets

SEMICONDUCTOR PACKAGE REPAIR PROCESS

CROSS-REFERENCE TO RELATED APPLICATION(S)

This application claims the benefit of U.S. Provisional Patent Application Ser. No. 61/445,360, filed Feb. 22, 2011, the contents of which are hereby incorporated by reference in their entirety.

BACKGROUND OF THE INVENTION

Electronic devices used in electronic packages (e.g., processor silicon packages) are sometimes implemented using a connection between components of the electronic package. For example, an electronic device may implement a connection from a silicon element to a printed circuit board (PCB). This connection may allow for the integration of and/or communication between components in the electronic package (e.g., processor die with other products). However, this connection between components has been known to fail. For example, the failure of a connection between a processor die and the PCB may result in the failure of the electronic device.

One reason that the electronic device may fail may be due to cold solder joints. The failure of cold solder joints may be attributed to the added mass of the silicon packages that absorb the heat flow and inhibits the proper soldering of solders on the PCB for example.

In the case of the inhibition of proper soldering, the solder may not be properly melted underneath the package. This failure to properly melt the solder can lead to voids (air bubbles) and weak spots in the solder known as cold solder joints. Because of prolonged constant temperature changes inside electronic devices, such as electronic gaming devices for example, the voids can cause cracking. In other cases, the temperature changes can cause shearing between components, such as the PCB and the substrate for example. This shearing can result in the break of the connection between the substrate and the PCB.

The failure of electronic devices, such as electronic gaming devices for example, can lead to costly repairs. Systems, methods, and apparatus embodiments that are capable of repairing a damaged connection (e.g., die to PCB connection) may be useful in repairing any device that uses similar connections (e.g., die to a PCB connection) for example.

SUMMARY OF THE INVENTION

This Summary is provided to introduce various concepts in a simplified form that are further described below the Detailed Description.

Systems, methods, and apparatus embodiments are described herein for repairing a damaged connection between components in an electronic package implemented in an electronic device. As described herein, an electronic package may include a damaged connection between a first component and a second component in the electronic package. According to an example embodiment, the first component may be a die and the second component may be a printed circuit board (PCB). The damaged connection may restrict effective electrical communication between the first component and the second component. To repair the damaged component, the electronic package may be placed into a repair apparatus that includes at least one heating element that is aligned with the damaged connection and at least one cooling element. The at least one heating element may be activated to transfer heat to the electronic package for reforming the damaged connection between the first component and the second component. The reforming of the damaged connection may enable effective electrical communication between the first component and the second component. The at least one cooling element may be activated for cooling at least one component in the electronic package to prevent damage due to the transfer of the heat from the at least one heating element.

According to another example embodiment, an apparatus is described herein for repairing a damaged connection between a first component and a second component in an electronic package. The damaged connection may restrict effective electrical communication between the first component and the second component. The apparatus may include at least one heating element and at least one cooling element. In one example embodiment, the at least one heating element may be aligned with the damaged connection. The at least one heating element may be configured to transfer heat to the electronic package for reforming the damaged connection between the first component and the second component to enable effective electrical communication between the first component and the second component. In one example embodiment, the at least one cooling element may be aligned with the damaged connection. The at least one cooling element may be configured to cool a component in the electronic package to prevent damage to the component due to the transfer of the heat from the at least one heating element.

According to another example embodiment, the electronic package may include a connection other than the damaged connection. This connection may not be damaged and may have a different melting point than the damaged connection. Thus, while the at least one heating element may transfer heat to the electronic package for reforming the damaged connection, the at least one cooling element may be activated for cooling the other connection to prevent damage to the connection due to the transfer of heat from the at least one heating element.

According to another example embodiment, the at least one heating element and/or the at least one cooling element may be activated in a predetermined pattern to facilitate the reforming of the damaged connection.

This Summary is provided to introduce a selection of concepts in a simplified form that are further described below the Detailed Description. This Summary is not intended to identify key features or essential features of the claimed subject matter, nor is it intended to be used to limit the scope of the claimed subject matter. Furthermore, the claimed subject matter is not limited to embodiments that solve any or all disadvantages noted in any part of this disclosure.

BRIEF DESCRIPTION OF DRAWINGS

For a more complete understanding of the present disclosure and its advantages, reference is now made to the following description taken in conjunction with the accompanying drawings, in which like reference numerals represent like parts.

DETAILED DESCRIPTION

Before describing the various embodiments herein, definitions of words and phrases used in describing such embodiments are provided. The terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Exemplary embodiments, such as the embodiments illustrated in FIGS. 1 through 12, are described herein by way of illustration and should not be construed in any way to limit the scope of the various embodiments described herein. The embodiments described herein may be implemented in any suitably arranged manner to repair, solidify, alter, reform, or otherwise effect the connection between components of an electronic package of an electronic device, such as a ball grid array (BGA), or other surface-mount packaging for integrated circuits for example, and a printed circuit board (PCB) for example. The electronic device described herein may refer to an electronic gaming console or any other electronic device that implements the electronic package described herein.

Systems, methods, and apparatus are described herein that relate to placing a printed circuit board (PCB) or electronic package (e.g., which may include the PCB) into a repair apparatus that has at least one heating element and at least one cooling element. The at least one heating element and/or at least one cooling element may be aligned with at least one damaged connection in the electronic package or on the PCB. A damaged connection may include a silicon unit or a solder joint, which may be coupled to the PCB for example. According to an example embodiment, which is further described herein, the heating element and the cooling element may be activated to repair the damaged connection. In an example embodiment, the damaged connection may be repaired without removing the PCB from the electronic package. The heating element and/or the cooling element may be activated in a predetermined pattern to facilitate the coupling of the PCB to the silicon unit.

Figure 1:
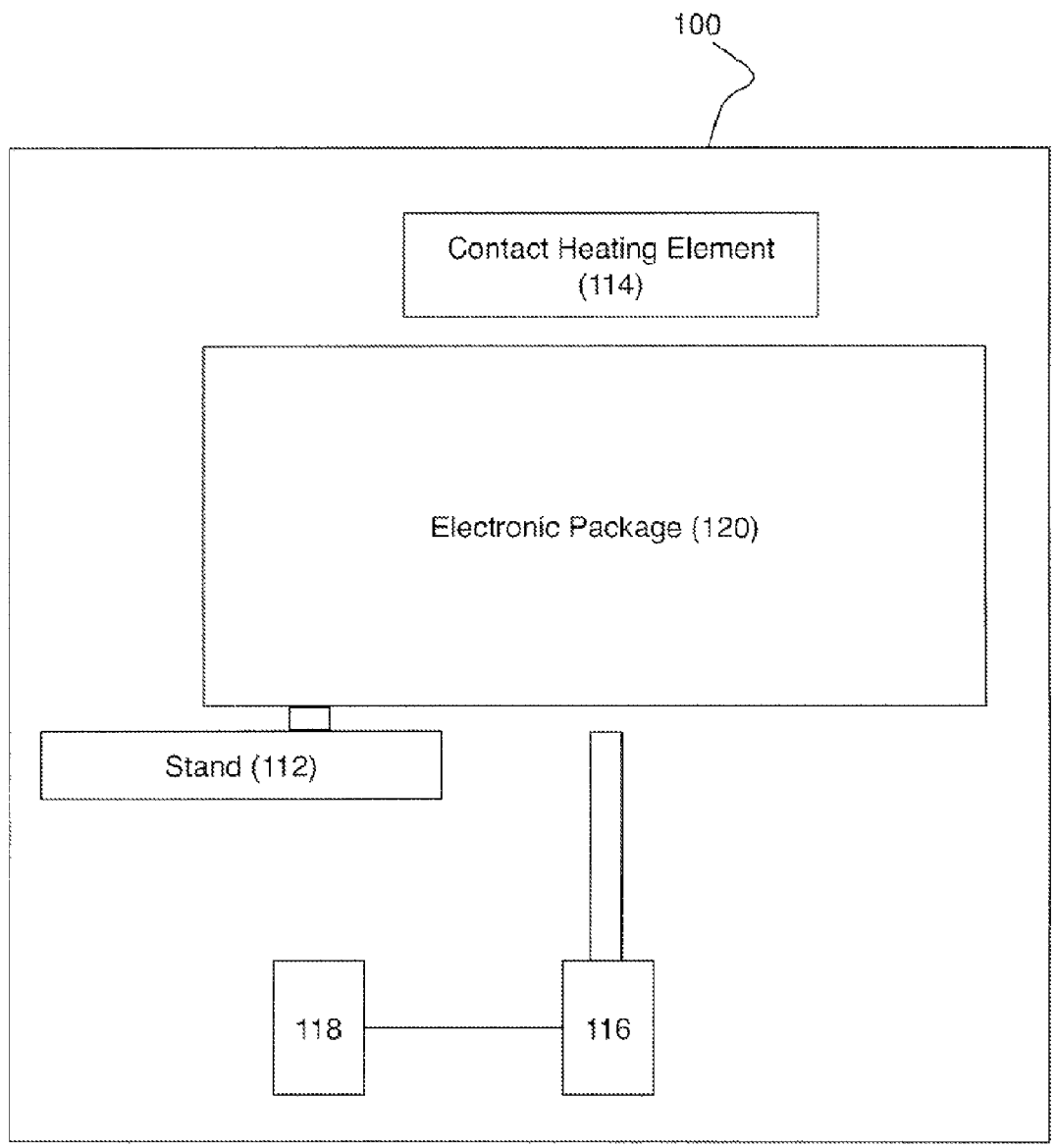
FIG. 1 illustrates an exemplary system according to an embodiment of the present disclosure.

FIG. 1 is a repair system 100 that may be used to effectuate repairs to an electronic package 120 using a contact heating element 114, a stand 112, a control module 118, and at least one coolant stored in a tank 116. In the embodiment shown in FIG. 1, an electronic package 120 is placed onto the stand 112. Heat (also known as thermal energy) may be applied to the electronic package 120 through the contact-heating element 114 while the electronic package 120 is simultaneously cooled by a cooling element, such as by the release of gas stored in tank 116 for example. As will be explained in more detail herein, the application of contact heating element 114 simultaneously with a cooling element (e.g., the release of gas from tank 116) allows various connections to be repaired within the electronic package 120 without damaging the components of the electronic package 120. Specific embodiments are disclosed herein for various ways to use system 100 in the repair of the electronic package 120.

The contact-heating element 114 illustrated in FIG. 1 may be any object capable of transferring heat into the electronic package 120. While, in an embodiment, the contact heating element 114 may actually contact an element of the electronic package 120, such as a die, in some embodiments the contact heating element 114 may not contact an element of the electronic package 120. For example, if contact-heating element 114 radiates sufficient heat to perform the repair to electronic package 120, the electronic package 120 and/or components therein may not need to come into explicit contact with the contact-heating element 114.

Control module 118 may be used to control the tank 116. Control module may be any device capable of sending either a mechanical impetus or electronic signal to the tank 116 to release the contents of the tank 116 in the proximity of electronic package 120. The term proximity is intended to refer to a relationship of the contents of the gas released by tank 116 at such a distance that the gas released by tank 116 is effective in cooling the components of the electronic package 120 and/or protecting the elements of the electronic package 120 from the heat generated by contact heating element 114.

Tank 116 is capable of holding any gas that may be used to control the temperature of the electronic package 120. In one example embodiment, this gas may be tetrafluoroethane, however any gas capable of preforming the cooling which does not damage the electronic package 120 may be used. For example dichlorodifluoromethane, pentafluoroethane, liquid nitrogen, and air cooling may be used.

While FIG. 1 illustrates a contact heating element 114, control module 118, and tank 116, these elements may be replaced with any other device, apparatus, structure, or system which can provide heating or cooling to the electronic package 120. For example, contact-heating element 114 could be replaced with another heating element, such as a heated gas for example. The heated gas may be used to flow over the electronic package 120 to repair a damaged connection as described herein. The control module 118 and tank 116 may be replaced with another cooling element, such as a contact-cooling element for example. For example, the contact-cooling element may comprise a refrigerator coil or other cooling element capable of cooling one or more components in the electronic package 120 when coming in contact with the electronic package 120 to prevent damage of components as a result of the heat from the heating element.

Figure 2:
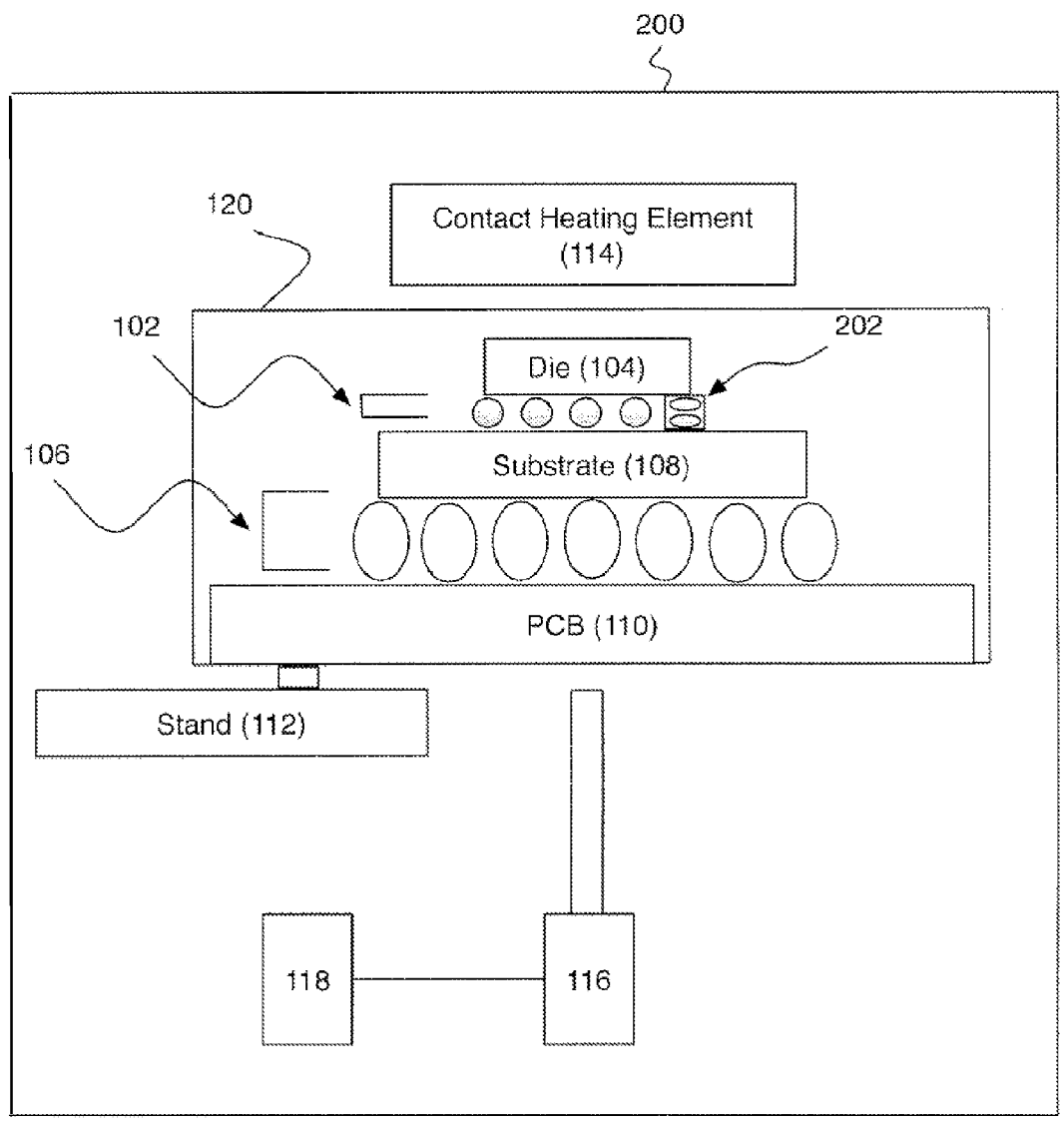
FIG. 2 illustrates an exemplary system according to an embodiment of the present disclosure wherein one of the connections is damaged.

FIG. 2 is a system 200 that includes the contents of the electronic package 120. As shown in FIG. 2, the electronic package 120 may comprise a die 104, a substrate 108, and/or a PCB 110. The die 104 and the substrate 108 are coupled using solder joints 102. PCB 110 and substrate 108 are coupled using solder joints 106.

In the example illustrated in FIG. 2, solder joint 202 may be damaged. For the purpose of clarity, a "damaged" joint may refer to any connection that does not promote effective electrical communication between the two elements it connects. In the example shown in FIG. 2, the damage to solder joint 202 may inhibit proper operation of the electronic package 120. While the defective solder joint in FIG. 2 is illustrated as being between the connection of the die 104 and the substrate 108, a faulty connection may be present between the substrate 108 and the PCB 110 and repaired with the embodiments described herein.

Solder joints 102 and 106 may comprise any kind of solder capable of coupling the connected parts. These connections may or may not comprise lead. The size of solder joints 102 and 106 is for exemplary purposes. The relative size of solder joints 102 and 106 may be based upon the design of PCB for example.

Figure 3:
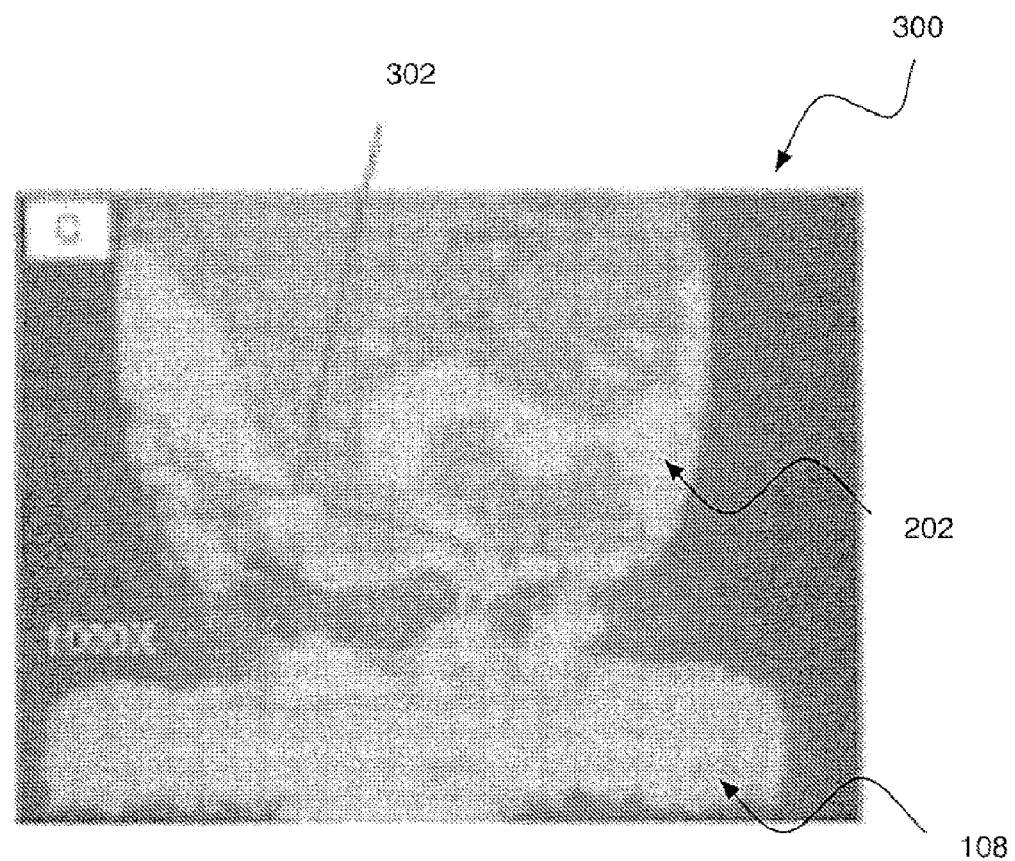
FIG. 3 is an illustration of the damaged connection illustrated in FIG. 2 according to one embodiment of the disclosure.

FIG. 3 illustrates an example 300 of the damaged joint 202. As described herein, the damaged joint 202 may be damaged through any of a variety of mechanisms. The damaged joint 202 may be damaged through shearing action between the two elements it couples, failure during the initial connection due to a cold joint, or any other mechanism or reason for example. FIG. 2 illustrates the damaged joint 202 and the substrate 108. The failure of the damaged joint 202 may be located at joint site 302, as illustrated in solder joint 300 in FIG. 3. As shown in FIG. 3, a complete failure of connection may not be needed to result in a damaged joint 202. The lack of a connection at joint site 302 is sufficient to result in an inhibition of proper electrical communication through the damaged joint 202.

Figure 4:
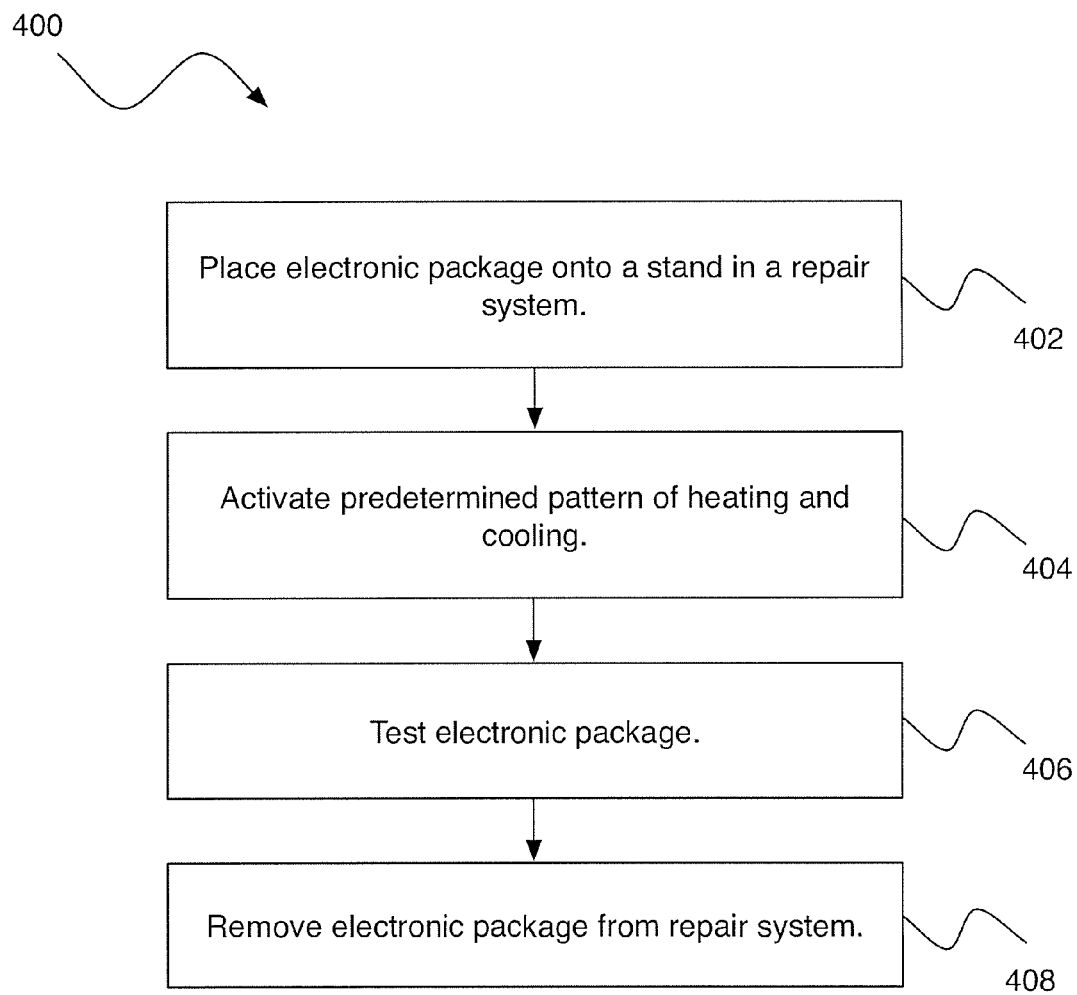
FIG. 4 is a flowchart illustrating an exemplary method of performing the repair process according to an embodiment of the disclosure.

FIG. 4 is a flowchart illustrating an exemplary method of performing a repair process. In the example shown in FIG. 4, the electronic package 120 may be placed onto a stand 112 in a repair system 100 at 402. At 404, a predetermined pattern of heating and cooling may be applied to the electronic package 120. The predetermined pattern of heating and cooling may create a reflow effect whereby the solder joints in the electronic package 120 are softened and reformed thereby repairing the damaged joint 202 within the electronic package 120. At 406, the electronic package 120 may be tested to confirm that the reflow was effective to repair the electronic package 120. At 408, the electronic package 120 may be removed from the repair system 100. The steps illustrated in FIG. 4 may occur in any order. For example, steps 406 and 408 may be reversed in their order of occurrence.

Figure 5:
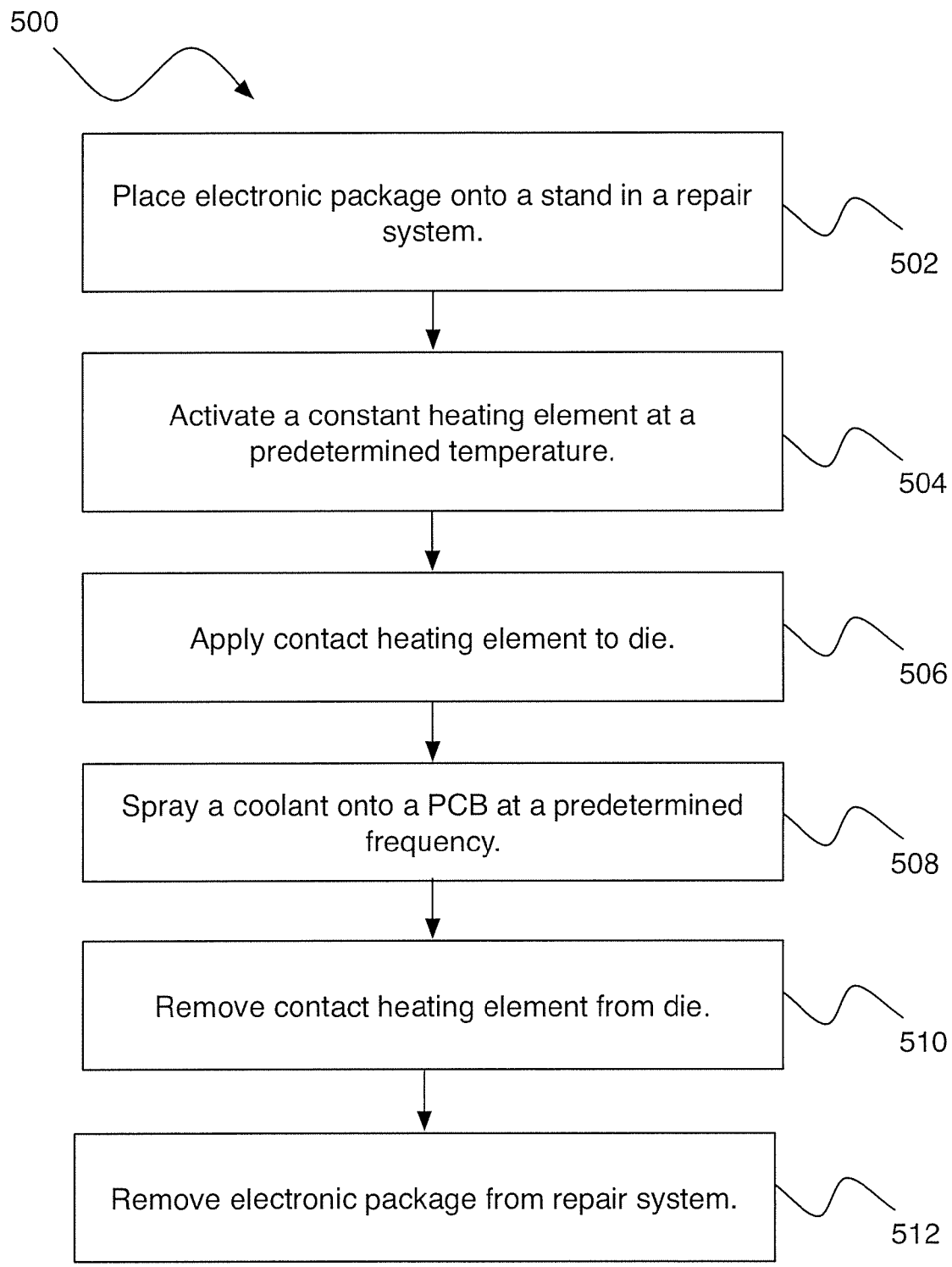
FIG. 5 is another flowchart illustrating an exemplary method of performing the repair process with heat applied to a die according to an embodiment of the disclosure.

FIG. 5 is a flowchart 500 illustrating another method of performing the repair using system 100. In the example shown in FIG. 5, the electronic package 120 is placed onto the stand 112 in a repair system 100 at 502. A contact-heating element 114 may be activated at a predetermined temperature at 504. The contact-heating element 114 may apply heat to the die 104 in block 506. At 508, a coolant may be sprayed onto the PCB 110 at a predetermined frequency to protect the components on the PCB 110 as well as other electronic components, such as the die 104 for example. The predetermined frequency may be such that the temperature of the PCB 110 may be maintained at a level that does not damage the PCB 110 while allowing the reflow to reform the solder joint connections. Once the reflow is complete, the contact-heating element 114 may be removed from contact with the die 104 and may be deactivated at 510. At 512, the electronic package 120 may be removed from the repair system 100.

Figure 6:
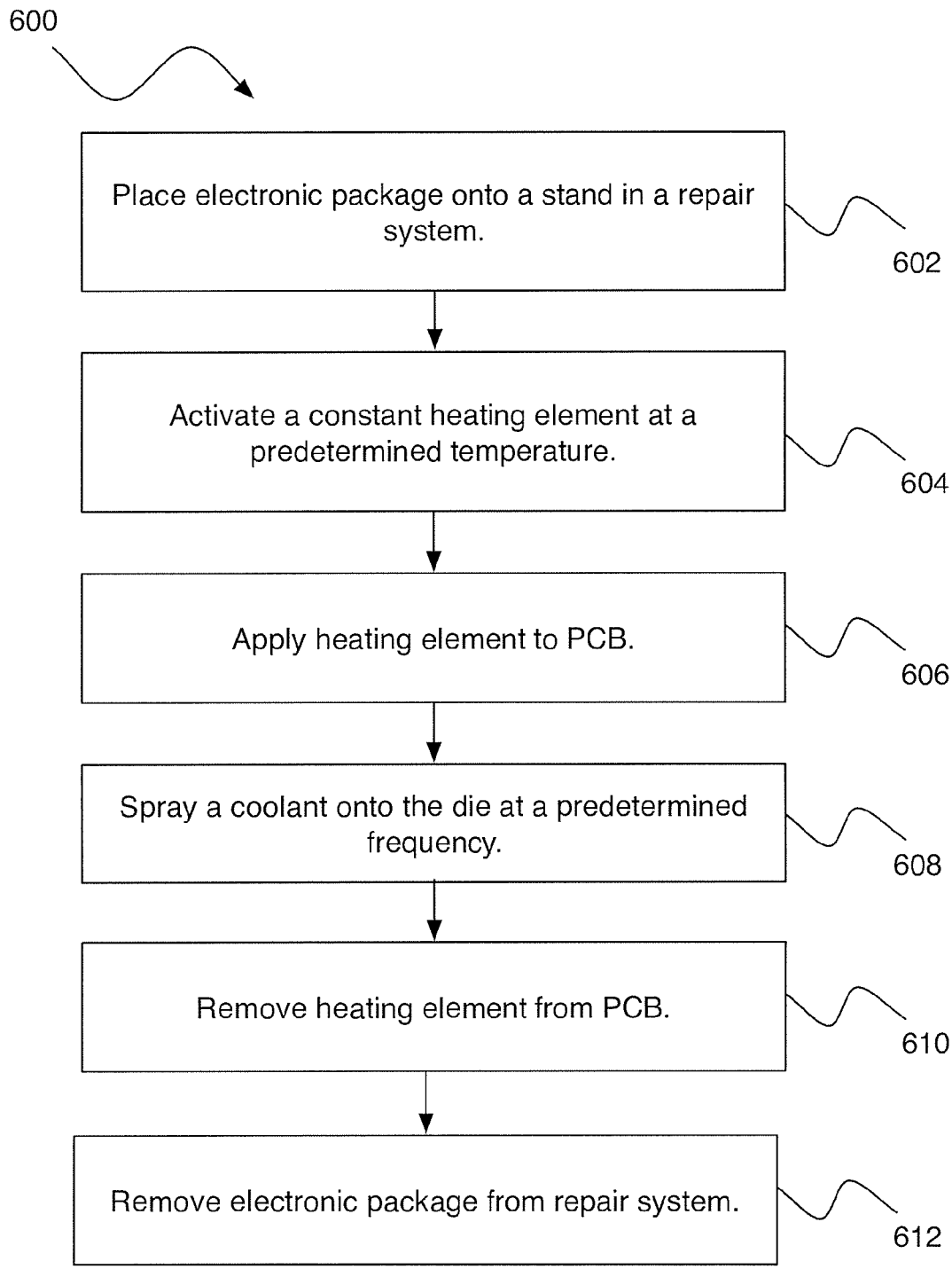
FIG. 6 is another flowchart illustrating an exemplary method of performing the repair process with heat applied to a PCB according to one embodiment of the disclosure.

FIG. 6 is a flowchart 600 illustrating another method of performing the repair using system 100. In the example shown in FIG. 6, the electronic package 120 is placed onto the stand 112 in a repair system 100 at 602. A contact-heating element 114 may be activated at a predetermined temperature at 604. The contact-heating element 114 may apply constant heat to the PCB 110 at 606. While FIG. 6 illustrates the application of constant heat from the contact-heating element 114, the heat may be applied intermittently or in any other manner which enables repair of a damaged connection in an electronic package. At 608, a coolant may be sprayed onto the die 104 at a predetermined frequency to protect the components of the electronic package 120 (e.g., components on the PCB 110 and the die 104). The predetermined frequency may be such that the temperature of the PCB 110, or other components of the electronic package 120 for example, may be maintained at a level that does not damage the PCB 110, or other components, while allowing the reflow to reform the solder joint connections. Once the reflow is complete, the contact heating element 114 may be removed from contact with the PCB 110 and deactivated at 610. At 612, the electronic package 120 may be removed from the repair system 100.

Figure 7:
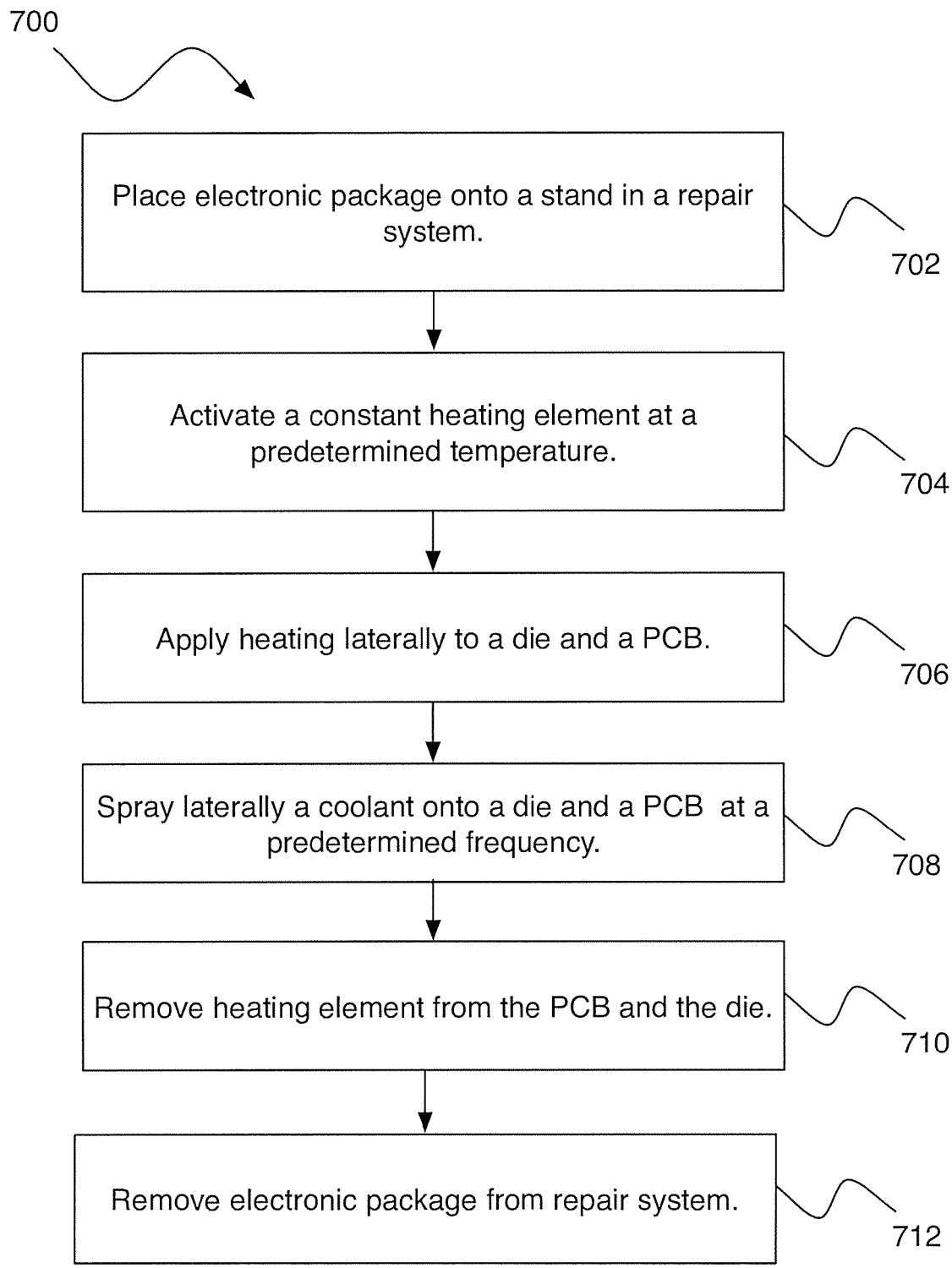
FIG. 7 is another flowchart illustrating an exemplary method of performing the repair process with heat applied laterally to a PCB according to one embodiment of the disclosure.

FIG. 7 is a flowchart 700 illustrating another method of performing the repair using system 100. In the example shown in FIG. 7, the electronic package 120 may be placed onto the stand 112 in a repair system 100 at 702. A contact-heating element 114 may be activated at a predetermined temperature at 704. For the purpose of the example illustrated in FIG. 7, the contact-heating element 114 may be a heating source that radiates heat through indirect rather than direct contact. The contact-heating element 114 may apply heat laterally to the PCB 110 and/or the die 104 at 706. At 708, a coolant may be sprayed onto the die 104 and/or the PCB 110 at a predetermined frequency to protect the components on the PCB 110 and the die 104. The predetermined frequency may be such that the temperature of the PCB 110 is maintained a level that does not damage the PCB 110, while allowing the reflow to reform the solder joint connections. Once the reflow is complete, the contact-heating element 114 may be removed from contact with the PCB 110 and deactivated at 710. At 712, the electronic package 120 may be removed from the repair system 100.

The example of FIG. 7 may allow for a lateral, rather than a horizontal repair. A horizontal repair may apply heat and/or coolant directly to the die 104 or the PCB 110 of the electronic package 120 for example. The application of the heating and cooling sources may be from any angle on any side of the electronic package 120 so long as the temperature allows for the reforming of the solder joints in the electronic package 120. In some types of electronic packages, such as a multistack die configuration for example, the application of heat and/or coolant may be implemented laterally, instead of the application of heat or coolant to the die 104 or to the PCB 110 directly for example.

Figure 8:
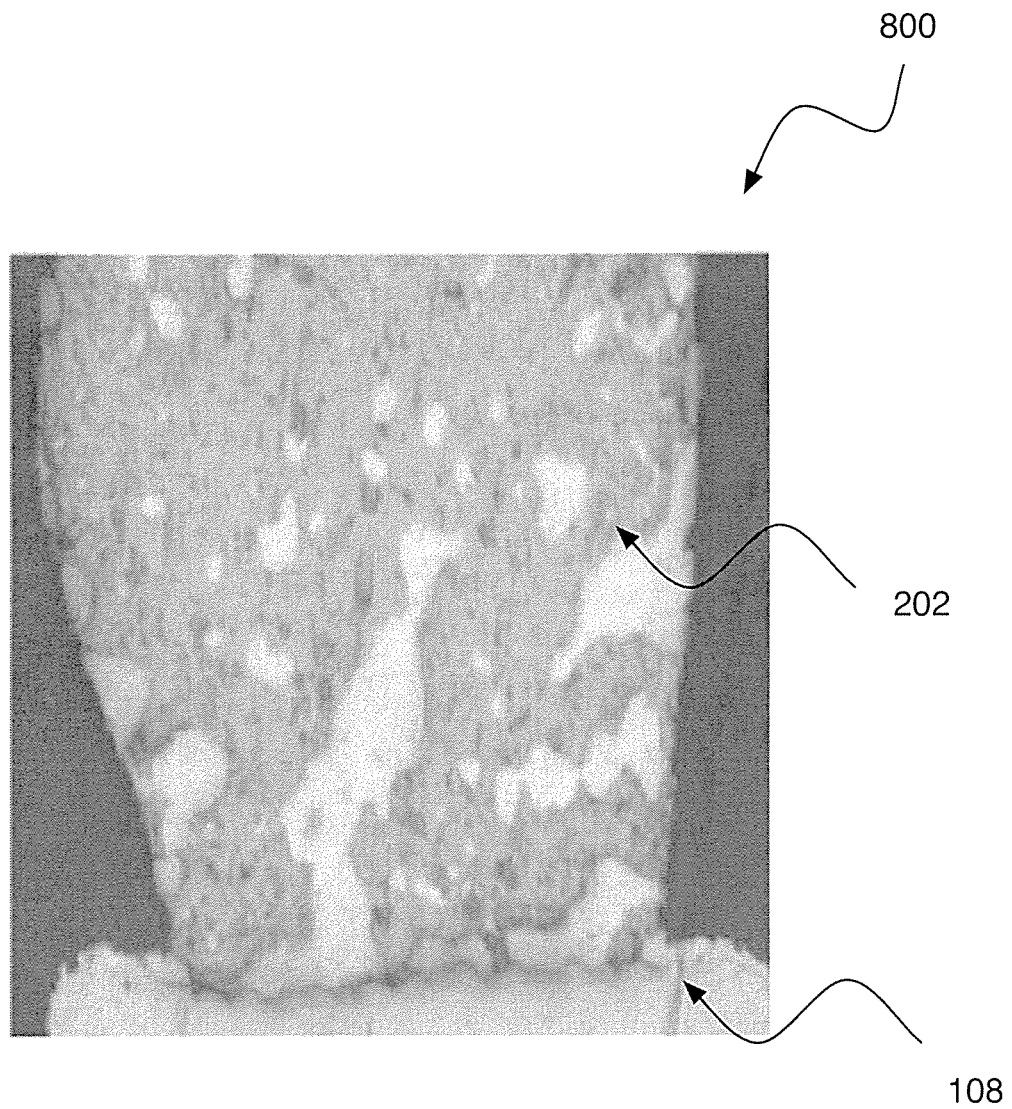
FIG. 8 is an illustration of a repaired connection according to an embodiment of the disclosure.

FIG. 8 is an illustration 800 of the repaired damaged joint 202. FIG. 8 shows that the damaged section has been repaired through the reflow process, as described herein. FIG. 8 also illustrates the substrate 108.

Figure 9:
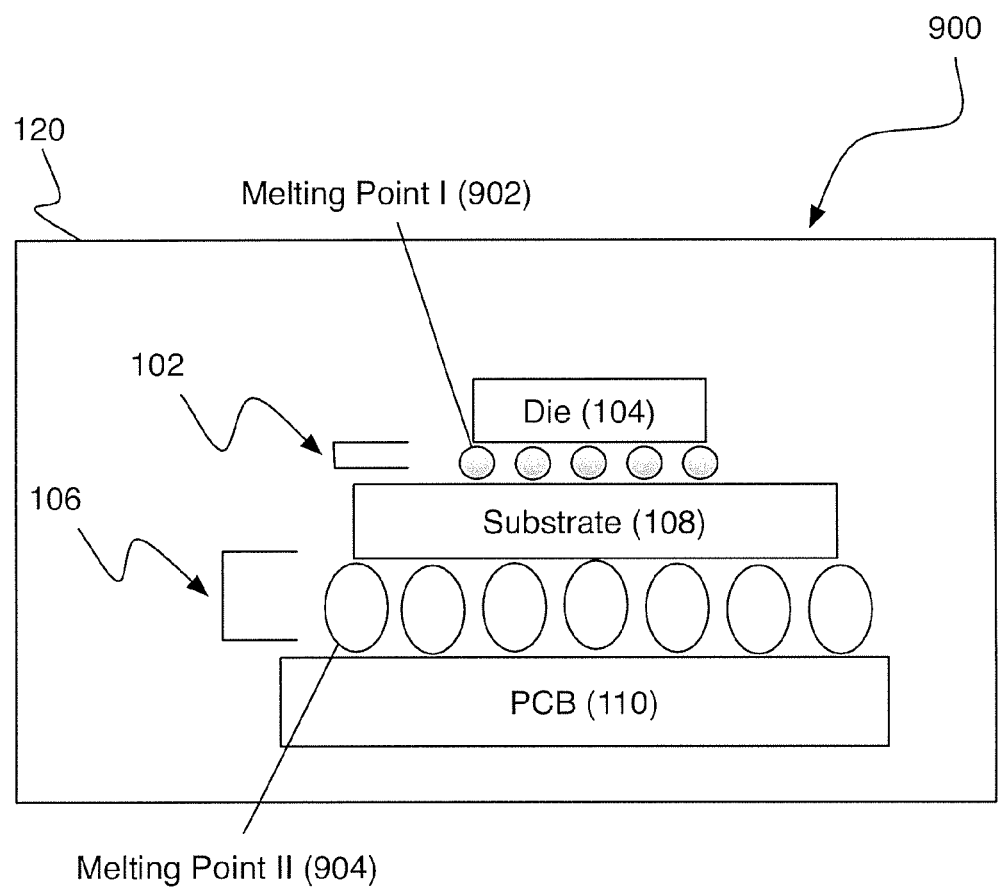
FIG. 9 is an illustration of a package with a plurality of different melting points according to an embodiment of the disclosure.

FIG. 9 is an illustration 900 of the package 120 illustrating the presence of a plurality of melting points within the solder joints within the electronic package 120. In determining the time to apply heat, the temperature at which to heat, and/or the amount of cooling to be used, the melting point of the various solder joints may be determined. For example, the melting point 1902 between for the solder joints 102 may be 350 degrees Celsius and the melting point II 904 of solder joints 106 may be 183 degrees Celsius. The melting degree difference means that the solder joints 106 may be more sensitive to temperature changes, while solder joints 102 may need additional heat to reform. To balance the needs of different melting points, the following balancing factors may be taken into consideration: (a) melting point and/or relative position of the solder joints; (b) area of the die; (c) tolerances of electronic components within the electronic package to heat, cold, and various heating and cooling compounds; (d) composition of the solder joints; and/or (e) other factors (e.g., ability to provide direct contact to the die, direct contact to the PCB 110, etc.) that may alter the temperature and/or time constraints to provide for the reforming of solder joints through reflow.

Figure 10:
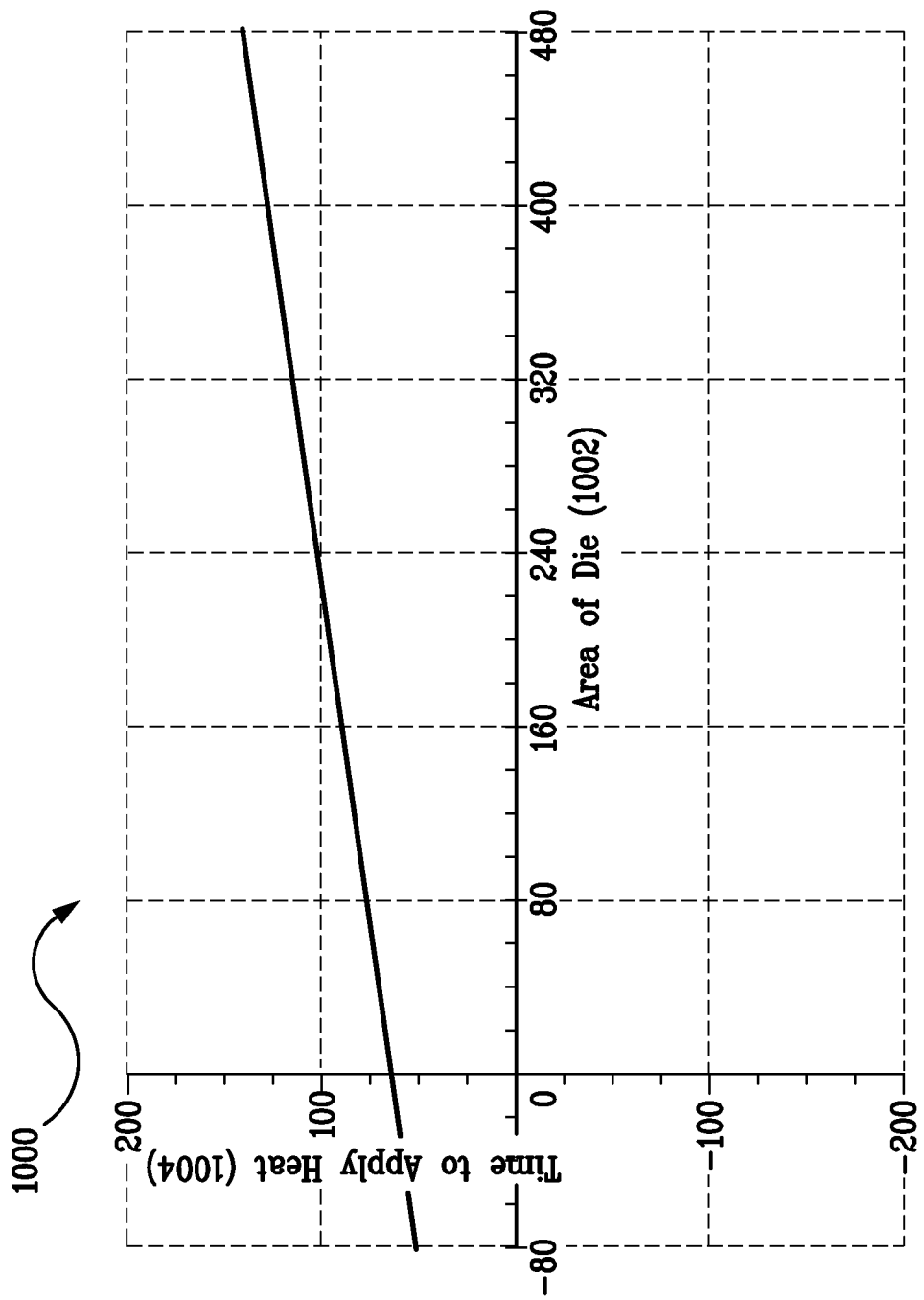
FIG. 10 is a correlation of the time to apply heat with the area of a die according to an embodiment of the disclosure.

Using the factors described herein, an equation may be extrapolated for an example configuration of the package illustrated in FIG. 2 with solder joints 102 comprising 95Pb5Sn solder joints and solder joints 106 comprising 37Pb63Sn solder joints. The graph 1000 is illustrated in FIG. 10 with the time to apply heat (seconds) 1004 shown as the y axis and the area of the die (mmA2) 1002 shown in the x axis at a constant temperature 325 degrees Celsius. This linear relationship may allow for different die sizes with different connections to be repaired by applying heat for a predetermined and/or proportional amount of time. For example, different die sizes may be repaired with the composition of the 95Pb5Sn solder joints and the 37Pb63Sn solder joints. If other compounds were present, a phase diagram may be used to establish the temperature to be used by a repair material with the highest melting point to be repaired at which the repair material at least becomes "pasty," or at a temperature above where the material is completely solid for example. According to an example embodiment, this temperature above where the material is completely solid may be considered the minimum threshold for the contact-heating element 114 to create. Once the minimum temperature is determined for the electronic package 120, the amount of time to apply the minimum heat is then correlated to a sufficient time for the solder to coagulate in light of the factors discussed above and the die size. One example of such an equation which shown in the graph 1000 is in Equation 1 which is reproduced below:

$$t = (0.1578 * a) + 63.2 \qquad \text{[Equation 1]}$$

(Where t=time to apply heat (325° C.) in seconds and a=area of die in mm$^2$).

In addition to, or alternative to, the time to heat being determined, the temperature at which the PCB 110, or other components of the electronic package 120 for example, is to be cooled may be determined. Upon the determination of the temperature desired to be maintained by the release of the tank 116, the pattern at which the control module 118 releases the gas may be determined. In some embodiments, the control module may comprise a sensor that indicates the current temperature such that the control module 118 may maintain a temperature below a threshold. In the example embodied by graph 1000 using the 95Pb5Sn solder joints and 37Pb63Sn solder joints, a temperature of 65 degrees Celsius may be desired. This temperature protects the PCB 110 and the solder joints 106 while allowing sufficient heat to be passed into the solder joints 102 to enable repair. The determination of the temperature to be maintained by the control module 118 may also be dependent upon the balancing factors described herein.

Figure 11:
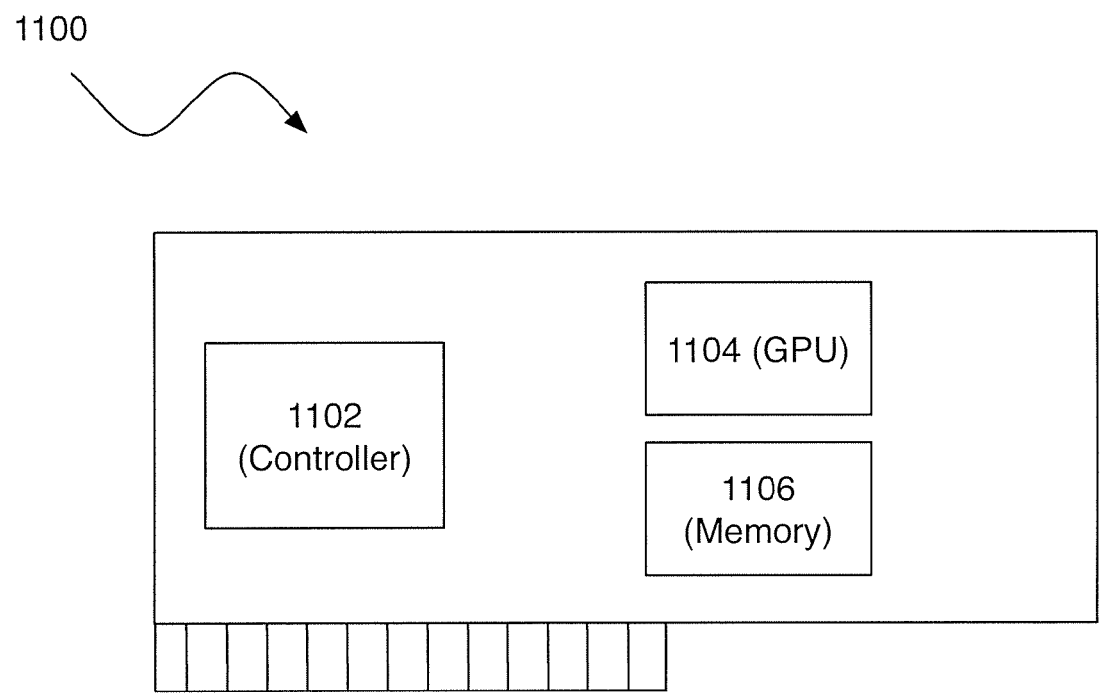
FIG. 11 is a graphics card which may be repaired using at least one embodiment the disclosure.
Figure 12:
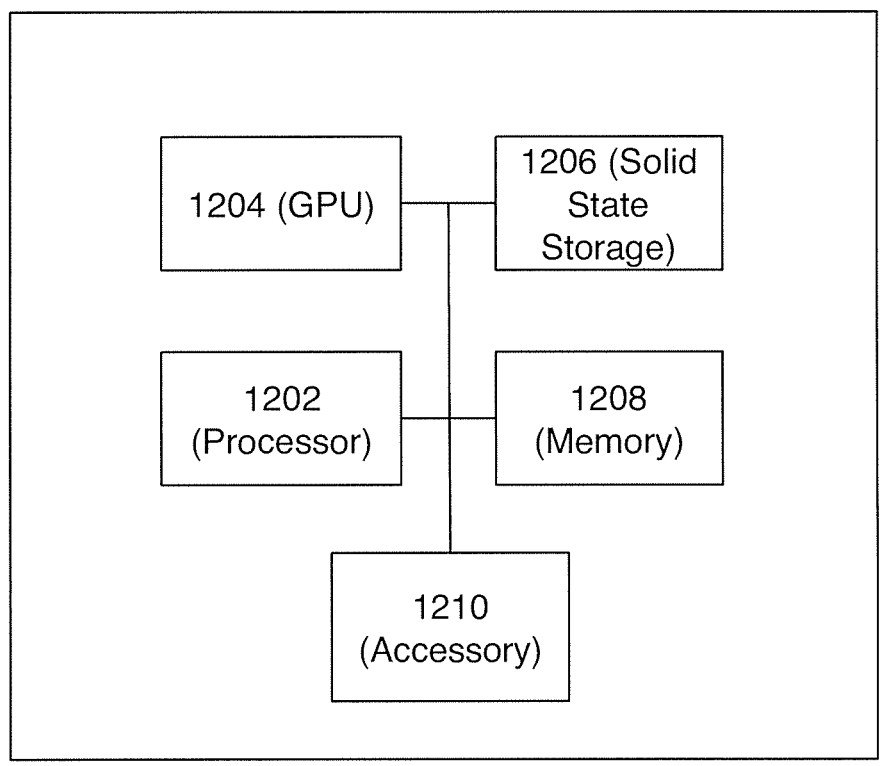
FIG. 12 is an example embodiment of a motherboard that may be repaired using at least one embodiment of the disclosure.

The systems, methods, and apparatus described herein may be used to repair a plurality of different devices, such as the devices within a gaming console for example. For example, the embodiments described herein may be used to repair graphics cards, such as the graphics card illustrated by FIG. 11, and/or motherboards, such as the motherboard illustrated by FIG. 12. FIG. 11 illustrates a graphics card 1100 comprising a plurality of different components that may be repaired using the embodiments described herein. These components may include a controller 1102, a graphics-processing unit (GPU) 1104, and/or a memory component 1106. FIG. 12 illustrates a motherboard 1200 comprising a plurality of different components that may be repaired using the embodiments described herein. These components may include a GPU 1204, a solid-state storage 1206, a processor 1202, a memory 1208, and/or an accessory 1210. The GPU 1204 may be any graphics processor that has at least one solder joint. Similarly, the solid-state storage 1206, memory 1208, and/or accessory 1210 may be any electronic storage or computing accessory device comprising at least one solder joint. The processor 1202 may be any processor, including, but not limited to, a central processing unit, comprising at least one solder joint.

The systems, methods, and apparatus described herein may be designed such that, in some embodiments, the contact point of the contact heating element 114 matches the die size of the various components to be repaired. According to an embodiment, multiple contact heating elements may be used simultaneously on a single PCB 110 to effectuate multiple repairs to multiple components simultaneously. The disclosed systems, methods, and apparatus may be used in any device comprising at least one solder joint.

Although the embodiments herein have been described using various examples, these embodiments are not limited to such examples. It is intended that the embodiments described herein encompass various changes and/or modifications thereto.

What is claimed is:

1. A method for repairing a damaged connection between a first component and a second component in an electronic package comprising a plurality of components, wherein the damaged connection restricts effective electrical communication between the first component and the second component, the method comprising:

placing the electronic package into a repair apparatus that includes at least one heating element that is aligned with the damaged connection and at least one cooling element;

activating the at least one heating element to transfer heat to the electronic package for reforming the damaged connection between the first component and the second component to enable effective electrical communication between the first component and the second component; and activating the at least one cooling element for cooling at least one component, of the plurality of components in the electronic package, to prevent damage due to the transfer of the heat from the at least one heating element.

2. The method of claim 1, wherein the first component comprises a die and the second component comprises a printed circuit board.

3. The method of claim 2, wherein the at least one component comprises the printed circuit board, and wherein the at least one cooling element is activated for cooling the printed circuit board to prevent damage to the printed circuit board due to the transfer of the heat from the at least one heating element.

4. The method of claim 2, further comprising applying the at least one heating element to the die, and wherein the at least one heating element is applied at a predetermined temperature and for a predetermined period of time based on a size of the die.

5. The method of claim 2, wherein the damaged connection is reformed without removing the printed circuit board from the electronic package.

6. The method of claim 1, wherein the at least one heating element and the at least one cooling element are each activated at a predetermined temperature or a predetermined frequency.

7. The method of claim 1, wherein the at least one heating element transfers heat to the electronic package such that the damaged connection is reformed without the heating element contacting the electronic package.

8. The method of claim 1, further comprising testing the electronic package to confirm that the damaged connection between the first component and the second component has been reformed to enable the effective electrical communication between the first component and the second component.

9. The method of claim 1, further comprising applying the heat to the electronic package at a lateral angle to enable reform of the damaged connection.

10. The method of claim 1, wherein the damaged connection comprises a soldering joint.

11. The method of claim 1, wherein the electronic package comprises at least one portion of a graphics card or a motherboard of a gaming console.

12. The method of claim 1, wherein the first component comprises a die and the second component comprises a substrate, and wherein the electronic package further comprises another connection between the substrate and a printed circuit board.

13. The method of claim 12, wherein a melting point of the damaged connection is greater than a melting point of the other connection, and wherein the at least one cooling element is activated for cooling the other connection to prevent damage due to the transfer of the heat from the at least one heating element.

14. The method of claim 1, wherein the at least one cooling element comprises tetrafluoroethane, dichlorodifluoromethane, pentafluoroethane, liquid nitrogen, or air.

15. An apparatus for repairing a damaged connection between a first component and a second component in an electronic package comprising a plurality of components, wherein the damaged connection restricts effective electrical communication between the first component and the second component, the apparatus comprising:

at least one heating element, being aligned with the damaged connection, that is configured to transfer heat to the electronic package for reforming the damaged connection between the first component and the second component to enable effective electrical communication between the first component and the second component; and at least one cooling element, being aligned with the damaged connection, that is configured to cool at least one component, of the plurality of components in the electronic package, to prevent damage due to the transfer of the heat from the at least one heating element.

16. The apparatus of claim 15, wherein the at least one cooling element comprises a tank that includes a coolant capable of cooling the at least one component, of the plurality of components in the electronic package, to prevent damage due to the transfer of the heat from the at least one heating element.

17. The apparatus of claim 16, wherein the coolant comprises tetrafluoroethane, dichlorodifluoromethane, pentafluoroethane, liquid nitrogen, or air.

18. The apparatus of claim 16, further comprising a control module used to control the release of the coolant in the tank.

19. The apparatus of claim 18, wherein the control module comprises a sensor that indicates a current temperature such that the control module may maintain a temperature below a threshold.

20. The apparatus of claim 15, wherein the first component comprises a die and the second component comprises a printed circuit board.

21. The apparatus of claim 15, wherein the damaged connection comprises a soldering joint.

* * * * *